United States Patent
Brown et al.

(10) Patent No.: US 6,220,259 B1
(45) Date of Patent: Apr. 24, 2001

(54) TANK DESIGN FOR SONIC WAFER CLEANING

(75) Inventors: Brian J. Brown, Palo Alto; Boris Fishkin, San Carlos, both of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/191,059

(22) Filed: Nov. 11, 1998

(51) Int. Cl.$^7$ ..................................................... B08B 3/10
(52) U.S. Cl. ........................ 134/184; 134/186; 134/902
(58) Field of Search ................................. 134/184, 186, 134/1.3, 902; 68/355; 366/127

(56) References Cited

U.S. PATENT DOCUMENTS

| | | | |
|---|---|---|---|
| 2,950,725 | * 8/1960 | Jacke et al. | 134/184 |
| 2,987,068 | 6/1961 | Branson . | |
| 3,001,532 | 9/1961 | Plassmeyer . | |
| 3,873,071 | * 3/1975 | Tatebe | 134/184 |
| 4,167,424 | 9/1979 | Jubenville et al. . | |
| 4,170,241 | 10/1979 | Clapp . | |
| 4,224,110 | * 9/1980 | McCord | 134/184 |
| 4,543,130 | 9/1985 | Shwartzman . | |
| 5,279,316 | 1/1994 | Miranda . | |
| 5,379,785 | * 1/1995 | Ohmori et al. | 134/184 |
| 5,579,792 | * 12/1996 | Stanasolovich et al. . | |
| 5,762,084 | * 6/1998 | Krusell et al. | 134/184 |
| 5,849,091 | * 12/1998 | Skrovan et al. | 134/184 |

FOREIGN PATENT DOCUMENTS

| | | | |
|---|---|---|---|
| 146936 | 3/1967 | (FR) . | |
| 54-103265 | * 8/1979 | (JP) | 134/184 |
| 04049619 | 2/1992 | (JP) . | |
| 04196219 | 7/1992 | (JP) . | |

* cited by examiner

*Primary Examiner*—Frankie L. Stinson
(74) *Attorney, Agent, or Firm*—Dugan & Dugan

(57) ABSTRACT

A sonic cleaning tank is provided that transmits energy from a side-wall-mounted transducer, parallel to a wafer, and reflects the sonic energy out of the plane of the wafer via an angled side wall positioned on the side of the wafer opposite the transducer. The angled side wall preferably forms a vertical V. Internal partitions may be optionally employed to partition reflected energy from the wafer. By configuring the relative angles and positions of tank walls and internal partitions, the path of reflected energy is advantageously controlled. Multiple reflections ensure that any reflected energy which impacts the wafer is sufficiently attenuated so as not to interfere with wafer cleaning.

16 Claims, 3 Drawing Sheets

TANK DESIGN FOR SONIC WAFER CLEANING

BACKGROUND OF THE INVENTION

Conventional megasonic cleaning tanks employ a fluid filled tank having substrate supports therein and a source of megasonic energy, (e.g., a transducer) coupled to the fluid for directing sonic energy through the fluid to the surfaces of a substrate or wafer supported therein. During megasonic cleaning, the transducer oscillates between a positive and a negative position at a megasonic rate so as to generate positive and negative pressures within the fluid (and thereby coupling megasonic energy to the fluid. As the energy imparted to the fluid oscillates between positive and negative pressure, cavitation bubbles form in the liquid during negative pressure and collapse or shrink during positive pressure. This bubble oscillation and collapse gently cleans the surface of the wafer.

Particles cleaned from the wafer are carried upward via a laminar flow of fluid and flushed into overflow weirs coupled to the top of the cleaning tank. Thus, a supply of clean fluid is continually introduced to the cleaning tank from the bottom of the side walls thereof. Cleaning fluid distribution nozzles are positioned along the bottom of the sidewalls to supply various cleaning fluids through the same nozzles or through dedicated sets of nozzles.

Most conventional cleaning tanks position one or more transducers along the bottom of the cleaning tank. Acoustic waves from these transducers reflect from the surface of cleaning fluid back into transducers, and interference results in reduced power density in the tank and reduced cleaning efficiency. Due to the limited area of the tank's bottom, the number, size, placement and shape of the transducers, fluid inlets, etc., often can not be freely selected for optimal performance. Particularly, positioning the transducer elsewhere would allow a higher laminar flow of fluid from the fluid inlets, and would decrease cleaning/processing time.

Accordingly, a need exists for an improved sonic cleaning tank that provides high laminar fluid flow yet avoids the interference of incident and reflected waves.

SUMMARY

The present invention provides a sonic cleaning tank having a side wall transducer and having a cleaning tank configured to reflect sonic waves away from the wafer, and to thereby avoid interference. Specifically, sonic waves are reflected out of the plane of the wafer, and thereafter undergo further reflection. By generating a plurality of reflections within the tank, the inventive tank design ensures that any reflected wave which impacts the wafer is sufficiently attenuated to avoid the negative effects of interference.

In a first aspect of the invention, a transducer is mounted on a first wall of the cleaning tank, a substrate receiving area is provided for supporting a substrate in parallel with energy wave rays emitted from the transducer and a second wall is located across the substrate receiving area from the first wall, and is angled such that energy wave rays emitted by the transducer impact the second wall and reflect out of the plane of the wafer. Preferably the second wall is angled to form a vertical V.

In a second aspect of the invention, one or more internal partitions extend from the first wall forming one or more partitioned regions to partition energy wave rays which impact the second wall and reflect out of the plane of the wafer.

In a third aspect, the second wall is angled to form a vertical V, and the angle of the V and the position of a side wall (coupled between the first and second walls) relative to the V are such that energy wave rays reflect from the V to the side wall and reflect from the side wall upwardly toward an air/liquid interface of the tank.

Other aspects of the invention position the apex of the second wall's V toward or away from the wafer and/or in line with the wafer or inline with an internal partition, to achieve desired reflection paths.

The various aspects of the invention provide a cleaning tank that is virtually free of interference from reflected energy wave rays yet maintains an open bottom for high laminar fluid flow. The resultant cleaning tank boasts high transducer efficiency and faster cleaning times due to the combination of transducer efficiency and high laminar flow.

Other objects, features and advantages of the present invention will become more fully apparent from the following detailed description of the preferred embodiments, the appended claims and the accompanying drawings.

DETAILED DESCRIPTION OF THE PREFERRED EMBODIMENTS

Figure 1A:
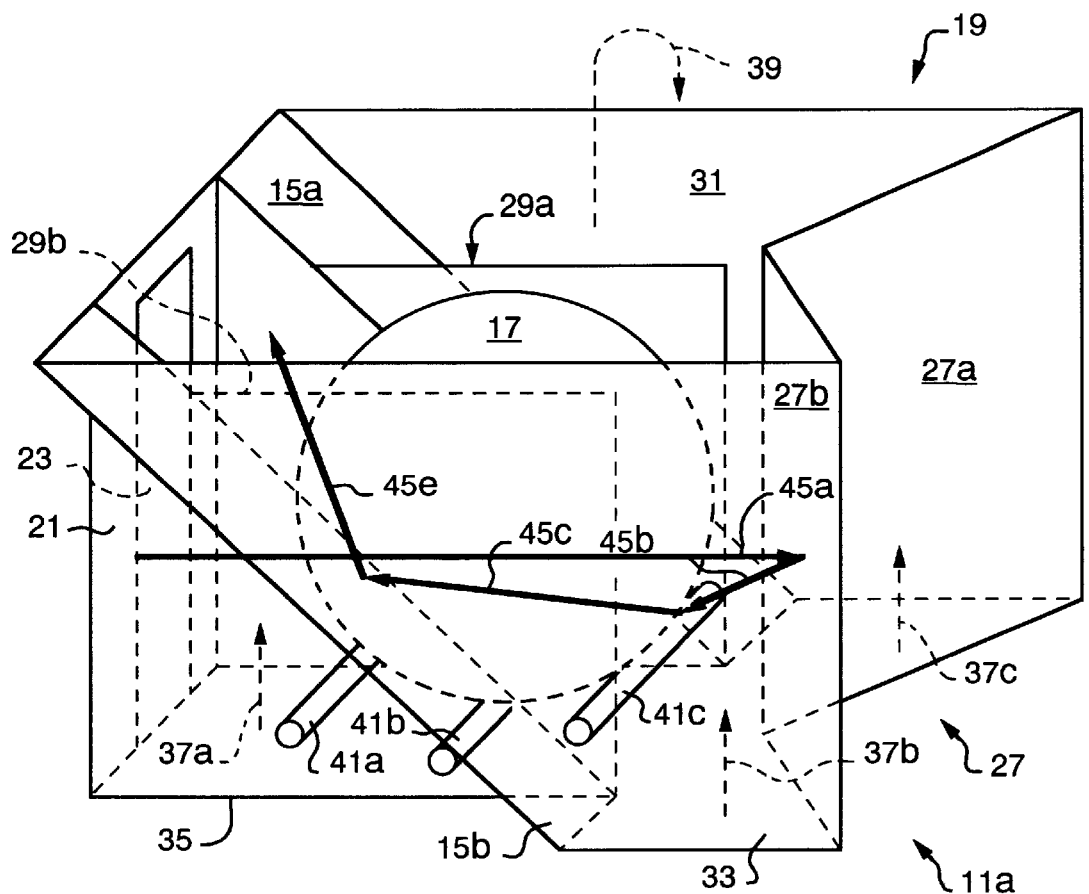
FIGS. 1A and 1B are a front perspective view and a top plan view, respectively, of a first preferred sonic cleaning tank embodying the invention.
Figure 1B:
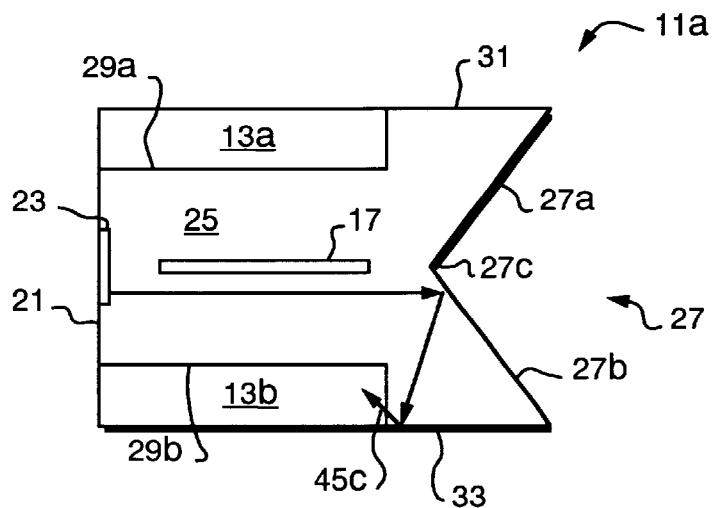

FIGS. 1A and 1B are a front perspective view and a top plan view, respectively, of a first cleaning tank 11a. As described below, the first cleaning tank 11a employs a pair of partitioned regions 13a, 13b having sloped bottom walls 15a, 15b, respectively, to partition reflected energy wave rays from a wafer 17, and to further reflect the energy wave rays upward from the partitioned regions 13a, 13b to an air/liquid interface 19.

The first cleaning tank 11a comprises a first wall 21 having a transducer 23 mounted thereto. The transducer 23 is dimensioned for maximum power density, and preferably has a length greater than the diameter of a wafer to be cleaned. Similarly, the width of the transducer 23 is preferably equal to the width of the wafer to be cleaned plus the tolerance required for wafer placement. By thus minimizing the width of the transducer 23 the volume of the tank is minimized. A wafer support mechanism is provided to support the wafer 17 in a wafer receiving area 25 so that the wafer 17 is parallel to energy wave rays emitted from the transducer 23. A second wall 27 is positioned across the wafer receiving area 25 from the first wall 21, and is angled so that energy wave rays emitted from the transducer 23 impact the second wall 27 and reflect out of the plane of the wafer 17, and into either the first partitioned region 13a or the second partitioned region 13b. Specifically, the second wall 27 is angled to form a V, which is oriented so that the point thereof extends vertically (i.e., a vertical V) as shown in FIG. 1A. The V comprises a first region 27a, and a second region 27b which angle away from the internal region of the first cleaning tank 11a, (i.e., the V points toward the wafer receiving area 25 of the first cleaning tank 11a). The point of the V is in line with the wafer 17.

The first partitioned region 13a comprises the sloped bottom 15a and a first internal partition 29a that extends from the first wall 21. The position of the first internal partition 29a, (e.g., the length which the first internal partition 29a extends from the first wall 21, and the distance between the first internal partition 29a and a back wall 31 which couples between the first wall 21 and the second wall 27) preferably is selected with reference to the position of the wafer 17, and the position (e.g., the length and the angle) of the second wall 27's first region 27a so that an energy wave ray which impacts any portion of the first region 27a reflects into the first partitioned region 13a, and is partitioned from the wafer 17 via the first internal partition 29a. Once inside the first partitioned region 13a, the reflected energy wave ray undergoes further reflection and eventually reflects upward to the air/liquid interface 19 by the first sloped bottom wall 15a.

Similarly the second partitioned region 13b comprises the sloped bottom 15b and a second internal partition 29b that extends from the first wall 21 and is located across the transducer 23 from the first internal partition 29a. The position of the second internal partition 29b (e.g., the length which the second internal partition 29b extends from the first wall 21, and the distance between the second internal partition 29b and a front wall 33 which couples between the first wall 21 and the second wall 27) preferably is selected with reference to the position of the wafer 17, and the position (e.g., the length and the angle) of the second wall 27's second region 27b so that an energy wave ray which impacts any portion of the second region 27b reflects into the second partitioned region 13b, and is partitioned from the wafer 17 via the second internal partition 29b. Once inside the second partitioned region 13b, the reflected energy wave ray undergoes further reflection and eventually reflects upward to the air/liquid interface 19 by the second sloped bottom wall 15b.

The first cleaning tank 11a also comprises a plurality of fluid inlets positioned along a bottom wall 35, as generally represented by the dotted arrows 37a–b, an overflow weir coupled along the entire top perimeter of the first cleaning tank 11a, as generally represented by the dotted arrow 39, and a wafer supporting mechanism such as a plurality of supports 41 positioned along the lower edge of the wafer 17. Preferably each support 41 is small, so as to minimize wafer shadowing and has a v-groove formed therein to minimize wafer contact.

The distance between the internal partitions 29a, 29b is equal to the width of the transducer 23, plus an additional 0 to 50% of transducer 23's width. The angle between the first and second regions 27a, 27b of the second wall 27 is greater than 90°, so that acoustic waves reflected from the first and second regions 27a, 27b reflect from the front and back wall 33, 31 at an angle less than 90°. The internal partitions 29a, 29b extend forward so that the rays reflected from a location near a point 27c (where the first and second regions 27a, 27b meet) strike the first or second regions 29a, 29b, but rays from the edges of the transducer 23 reflect from the first and second regions 27a, 27b to the front and back walls 31, 33 into the internal partitions 29b, 29a, respectively, and are trapped in the partitioned regions 13a, 13b.

In operation, the transducer 23 is energized and a plurality of energy wave rays are emitted from the transducer 23, such that the rays parallel to the wafer 17, and travel across the wafer receiving area 25 to the second wall 27. As the energy wave rays travel through the wafer receiving area 25 they sonically clean the wafer 17. A continuous laminar flow of cleaning fluid 37a–c is emitted from the tank bottom and sweeps particles dislodged from the surface of the wafer 17 up and into the overflow weir as represented by the dotted arrow 39. Preferably the supports 41a–c rotate causing the wafer 17 supported thereon to rotate such that each portion of the wafer 17 is cleaned. For simplicity, only a single representative energy wave ray is shown, as represented by arrows 45a–d. The first arrow 45a represents the energy wave ray emitted from the transducer 23 prior to any reflection thereof. After impacting the second wall 27, the energy wave ray reflects out of the plane of the wafer and impacts the front wall 33 as represented by the second arrow 45b. After impacting the front wall 33 the energy wave ray reflects into the second partitioned region 13b and impacts the second sloped bottom wall 15b as represented by the third arrow 45c. After impacting the second sloped bottom wall 15b the energy wave ray reflects upward to the air/liquid interface 19 where the energy wave ray is partially reflected back and partially exits the first cleaning tank 11a as represented by the fourth arrow 45d.

Thus, within the first cleaning tank 11a each of the plurality of energy wave rays emitted from the transducer 23 are reflected out of the plane of the wafer 17 and are partitioned from the wafer 17 via the first partitioned region 13a and the second partitioned region 13b. Because the point of the V is in line with the wafer 17, the wafer 17 shadows the point from energy wave rays, preventing energy wave rays from reflecting from the point into the wafer receiving area 25. The energy wave rays emitted closer to the surface 19, after reflection from the back or front walls 31, 33 impinge on the first or second internal partition 29c, 29b and may go through multiple reflections prior to striking the sloped bottom wall 15a, 15b and reflecting therefrom, as represented by arrow 45d.

Figure 2A:
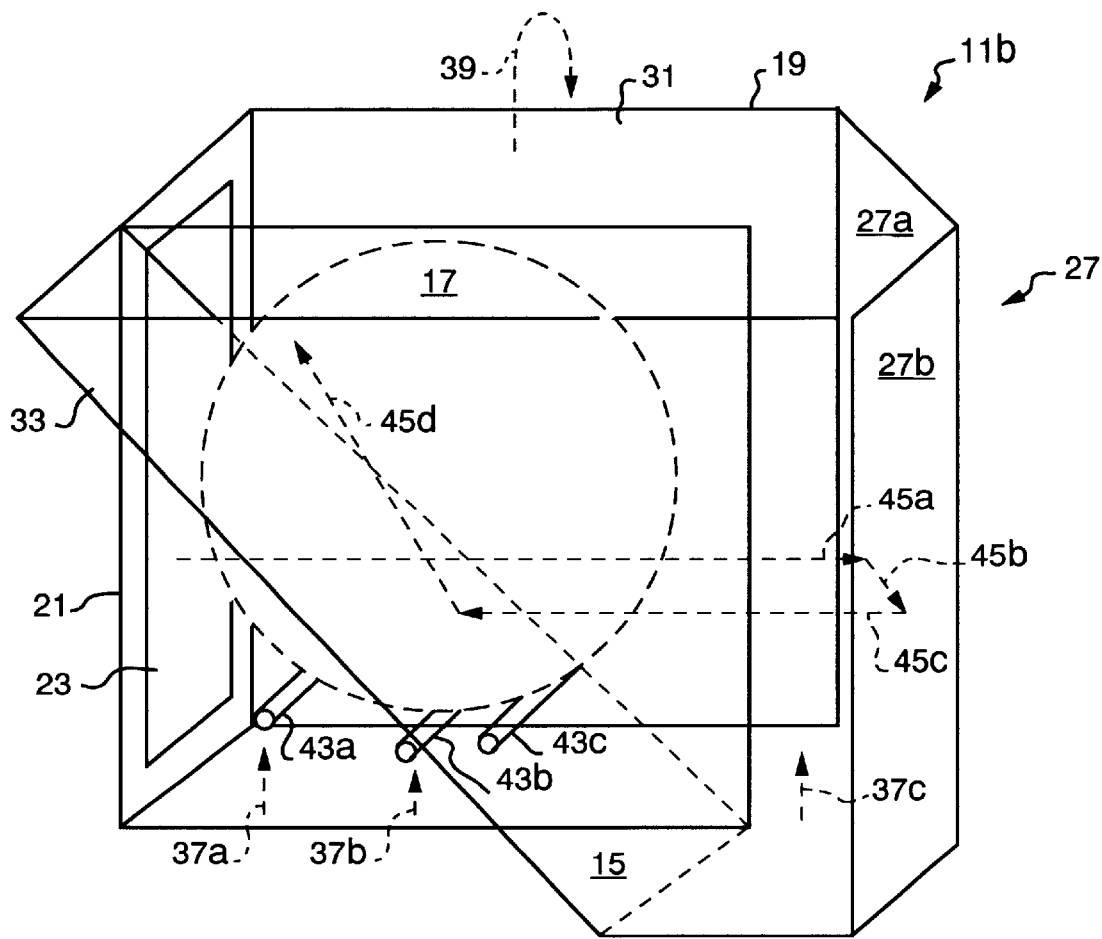
FIGS. 2A and 2B are a front perspective view and a top plan view, respectively, of a second preferred cleaning tank embodying the invention.
Figure 2B:
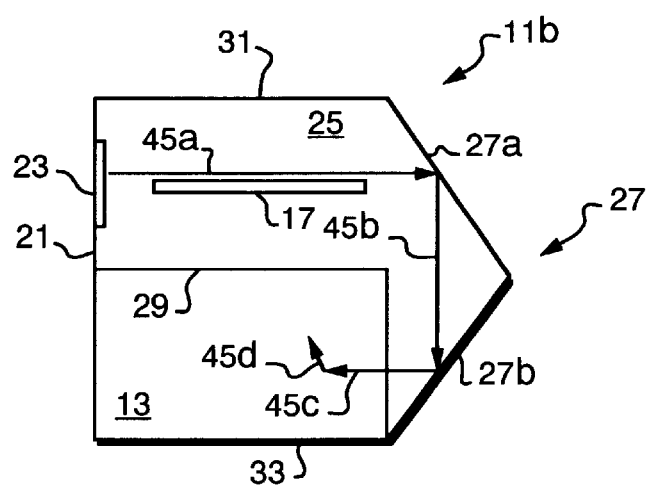

FIGS. 2A and 2B are a front perspective view and a top plan view, respectively, of a second cleaning tank 11b. As described below, the second cleaning tank 11b employs a single partitioned region 13 having a sloped bottom wall 15, to partition reflected energy wave rays from the wafer 17, and to further reflect energy wave rays upward from the partitioned region 13 to the air/liquid interface 19. The use of a single partitioned region 13 simplifies the tank's design and manufacture.

The first cleaning tank 11a and the second cleaning tank 11b differ primarily in the relative position and angling between the second wall 27 and the internal partition 29. Specifically, in the second cleaning tank 11b the V of the second wall 27 points away from the wafer receiving area 25 and is positioned in line with the internal partition 29. Thus, the first region 27a of the second wall 27 is positioned across the wafer receiving area 25 from the transducer 23, and the second region 27b of the second wall 27 is positioned in front of the sloped bottom wall 15. The position of the internal partition 29 preferably is selected with reference to the position of the wafer 17 and the position of the second wall 27, so that an energy wave ray which impacts any portion of the first region 27a of the second wall 27 is reflected to the second region 27b of the second wall 27, and is reflected from the second region 27b into the partitioned region 13. Once inside the partitioned region 13, the reflected energy wave ray undergoes further reflection and eventually reflects upward to the air/liquid interface 19 by the sloped bottom wall 15.

Other than the difference described above, the first cleaning tank 11a and the second cleaning tank 11b comprise the same components. The description of common components and their operation is therefore not repeated. Accordingly the path of the energy wave rays as they reflect within the second cleaning tank 11b are now described. For simplicity, only a single representative energy wave ray is shown, as represented by the arrows 45a–d.

In operation, an energy wave ray is emitted from the transducer 23, parallel to the wafer 17 and travels across the wafer receiving area 25 to the first region 27a of the second wall 27, as represented by the first arrow 45a. After impacting the second wall's first region 27a, the energy wave ray reflects into the partitioned region 13 and impacts the sloped bottom wall 15, as represented by the third arrow 45c. After impacting the sloped bottom wall 15 the energy wave ray reflects upward to the air/liquid interface 19 where it is partially reflected back and partially exits the second cleaning tank 11b.

Thus, within the second cleaning tank 11b each of the plurality of energy wave rays emitted by the transducer 23 are reflected out of the plane of the wafer 17 and are partitioned from the wafer 17 via the partitioned region 13; yet tank design and manufacture are simplified. To further simplify design and manufacture, internal partitions may be omitted and the tank walls themselves configured to reflect energy wave rays out of the wafer plane, and away from the wafer, as exemplified by FIGS. 3A and 3B.

Figure 3A:
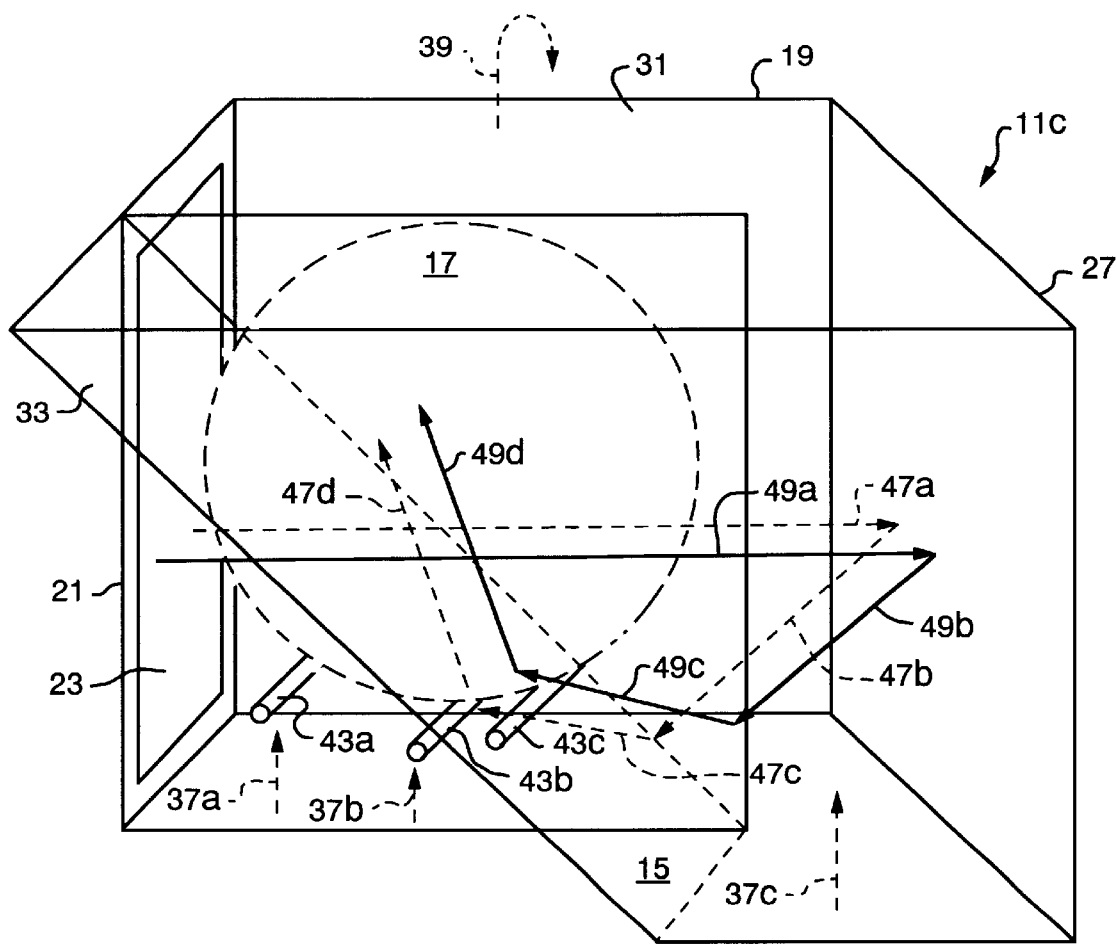
FIGS. 3A and 3B are a front perspective view and a top plan view, respectively, of a third preferred cleaning tank embodying the invention.
Figure 3B:
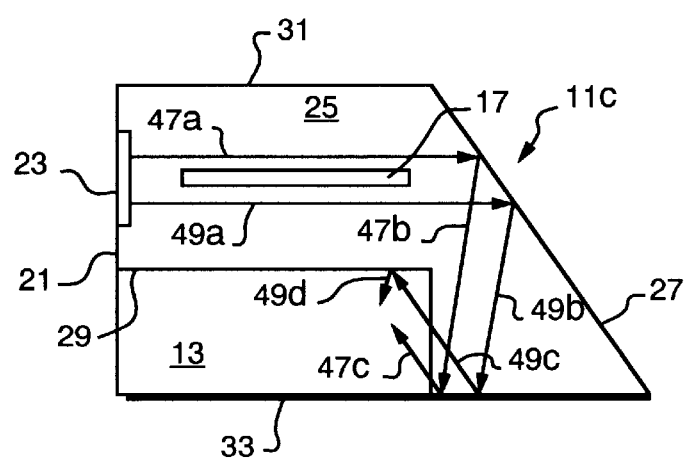

FIGS. 3A and 3B are a front perspective view and a top plan view, respectively, of a third cleaning tank 11c. As described below, the third cleaning tank 11c, like the second cleaning tank 11b, employs a single partitioned region 13 having a sloped bottom wall 15, to partition reflected energy wave rays from the wafer 17, and to further reflect energy wave rays upward from the partitioned region 13 to the air/liquid interface 19. The use of a single partitioned region 13 simplifies the tank's design and manufacture.

The second cleaning tank 11b and the third cleaning tank 11c differ primarily in the relative position and angling between the second wall 27 and the internal partition 29. Specifically, in the third cleaning tank 11c the second wall 27, rather than forming a V, extends in a line between the back wall 31 and the front wall 33 such that the second wall 27 slants away from the wafer receiving area 25. The position of the internal partition 29 preferably is selected with reference to the position of the wafer 17 and the slant of the second wall 27, so that an energy wave ray which impacts any portion of the second wall 27 is reflected into the partitioned region 13. Once inside the partitioned region 13, the reflected energy wave ray undergoes further reflection and eventually reflects upward to the air/liquid interface 19 by the sloped bottom wall 15.

Other than the difference described above, the second cleaning tank 11b and the third cleaning tank 11c comprise the same components. The description of common components and their operation is therefore not repeated. Accordingly the path of the energy wave rays as they reflect within the third cleaning tank 11c are now described. For simplicity, only a pair of representative energy waves are shown, as represented by the arrows 47a–d and 49a–d.

In operation, an energy wave ray is emitted from the transducer 23, parallel to the wafer 17 and travels across the wafer receiving area 25 to the second wall 27, as represented by the first arrows 47a, 49a. After impacting the second wall 27, the energy waves ray reflect therefrom to the front wall 33 as represented by the arrows 47b, 49b. Thereafter, the energy wave rays either impact the internal partition 29 and reflect therefrom to impact the sloped bottom wall 15 (arrows 49c and 49d) or reflect directly from the front wall 33 into the sloped bottom wall 15 (arrow 47c). After impacting the sloped bottom wall 15 the energy wave ray reflects upward to the air/liquid interface 19 where it is partially reflected back and partially exits the third cleaning tank 11c.

Thus, within the third cleaning tank 11c each of the plurality of energy wave rays emitted by the transducer 23 are reflected out of the plane of the wafer 17 and are partitioned from the wafer 17 via the partitioned region 13; yet tank design and manufacture are simplified.

The foregoing description discloses only the preferred embodiments of the invention, modifications of the above disclosed apparatus and method which fall within the scope of the invention will be readily apparent to those of ordinary skill in the art. Specific dimension and angles for exemplary tanks described above have not been provided, as armed with the present teachings, a person of ordinary skill in the art will be able to design any number of cleaning tanks, by varying angles and dimensions to achieve a desired energy wave ray path and to comply with limitations of a given space. For instance, the second wall may be angled in a number of configurations such as a horizontally oriented V, or a plurality of V's. As used herein, a substrate or a wafer includes, but is not limited to a semiconductor wafer with or without material layers thereon, whether patterned or unpatterned.

Accordingly, while the present invention has been disclosed in connection with the preferred embodiments thereof, it should be understood that other embodiments may fall within the spirit and scope of the invention, as defined by the following claims.

The invention claimed is:

1. A tank adapted to sonically clean a substrate, comprising:
   a first wall having a transducer mounted thereon adapted to output energy wave rays;
   a substrate receiving area adapted to support a substrate in parallel with the transducer's energy wave rays;
   a second wall, across the substrate receiving area from the first wall, the second wall being angled such that energy wave rays emitted by the transducer impact the second wall and reflect out of the plane of the substrate; and
   a third wall, being positioned to receive energy wave rays reflected from the second wall.

2. The tank of claim 1 further comprising a remaining portion of the tank configured such that an energy wave ray emitted from the transducer and reflected from the second wall will undergo a plurality of reflections within the tanks;
   wherein the remaining portion of the tank is further configured such that the reflections are out of the plane of the substrate.

3. A tank adapted to sonically clean a substrate, comprising:
   a first wall having a transducer mounted thereon adapted to output energy wave rays;
   a substrate receiving area adapted to support a substrate in parallel with the transducer's energy wave rays;
   a second wall across the substrate receiving area from the first wall, the second wall being angled such that energy wave rays emitted by the transducer impact the second wall and reflect out of the plane of the substrate; and
   an internal partition extending from the first wall forming a partitioned region to partition energy wave rays which impact the second wall and reflect out of the plane of the substrate.

4. The tank of claim 3 wherein the second wall forms a vertical V having an angle, and the angle of the V and the position of the internal partition are configured such that energy wave rays emitted from the transducer impact the V and reflect out of the plane of the substrate into the partitioned region.

5. The tank of claim 4 wherein the point of the V is in line with the internal partition and points away from the substrate.

6. A tank adapted to sonically clean a substrate, comprising:
- a first wall having a transducer mounted thereon adapted to output energy wave rays;
- a substrate receiving area adapted to support a substrate in parallel with the transducer's energy wave rays;
- a second wall across the substrate receiving area from the first wall, the second wall being angled such that energy wave rays emitted by the transducer impact the second wall and reflect out of the plane of the substrate;
- a first internal partition extending from the first wall, forming a first partitioned region; and
- a second internal partition extending from the first wall, forming a second partitioned region, the first internal partition and the second internal partition extending from opposite sides of the transducer, and wherein the second wall forms a vertical V having an angle, and the angle of the V and the position of the first and second partitions are configured such that energy wave rays emitted from the transducer impact the V and reflect out of the plane of the substrate into the first and second partitioned regions.

7. The tank of claim 6 wherein the point of the V is in line with the substrate and points toward the substrate.

8. A tank adapted to sonically clean a substrate, comprising:
- a first wall having a transducer mounted thereon adapted to output energy wave rays;
- a substrate receiving area adapted to support a substrate in parallel with the transducer's energy wave rays;
- a second wall across the substrate receiving area from the first wall, the second wall being angled such that energy wave rays emitted by the transducer impact the second wall and reflect out of the plane of the substrate; and
- a side wall coupled between the first wall and the second wall, and wherein the second wall forms a vertical V having an angle, and the angle of the V and the position of the side wall relative to the V are such that energy wave rays reflect from the V to the side wall and reflect from the side wall upwardly toward an air/liquid interface of the tank.

9. The tank of claim 8 wherein the point of the V is in line with the substrate and points toward the substrate.

10. The tank of claim 8 wherein the relative position of the V and the side wall is such that energy wave rays reflect from the side wall upwardly to the air/liquid interface of the tank without impacting a substrate located within the substrate receiving area.

11. tank adapted to sonically clean a substrate, comprising:
- a first wall having a transducer mounted thereon adapted to output energy wave rays;
- a substrate receiving area adapted to support a substrate in parallel with the transducer's energy wave rays;
- a second wall across the substrate receiving area from the first wall, the second wall being angled such that energy wave ravs emitted by the transducer impact the second wall and reflect out of the plane of the substrate; and
- a remaining portion of the tank configured such that an energy wave ray emitted from the transducer and reflected from the second wall will undergo a plurality of reflections within the tank;
- wherein the remaining portion of the tank is further configured such that the reflected energy wave ray will reflect upwardly and out of the tank without impacting the substrate located within the substrate receiving area.

12. The tank of claim 11 wherein the remaining portion of the tank is configured such that an energy wave ray undergoes a plurality of reflections prior to re-impacting a substrate located within the substrate receiving area.

13. A tank adapted to sonically clean a substrate, comprising:
- a first wall having a transducer mounted thereon adapted to output energy wave rays;
- a substrate receiving area adapted to support a single substrate in parallel with the transducer's energy wave rays; and
- a second wall across the substrate receiving area from the first wall, wherein the second wall forms a vertical V having an angle such that energy wave rays emitted by the transducer impact the second wall and reflect out of the plane of the substrate.

14. The tank of claim 13 wherein the energy waves emitted by the transducer impact the second wall and reflect out of the plane of the substrate without impacting the substrate.

15. A tank adapted to sonically clean a substrate, comprising:
- a first wall having a transducer mounted thereon adapted to output energy wave rays;
- a substrate receiving area adapted to support a single substrate in parallel with the transducer's energy wave rays; and
- a second wall across the substrate receiving area from the first wall, the second wall being slanted such that energy wave rays emitted by the transducer impact the second wall and reflect out of the plane of the substrate.

16. The tank of claim 15 wherein the energy waves emitted by the transducer impact the second wall and reflect out of the plane of the substrate without impacting the substrate.

* * * * *